(12) United States Patent
Ishida

(10) Patent No.: US 11,158,710 B2
(45) Date of Patent: Oct. 26, 2021

(54) DISPLAY DEVICE

(71) Applicant: Japan Display Inc., Minato-ku (JP)

(72) Inventor: Arichika Ishida, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 138 days.

(21) Appl. No.: 16/103,047

(22) Filed: Aug. 14, 2018

(65) Prior Publication Data

US 2019/0067399 A1 Feb. 28, 2019

(30) Foreign Application Priority Data

Aug. 24, 2017 (JP) .............................. JP2017-161138

(51) Int. Cl.
*H01L 29/417* (2006.01)
*H01L 27/12* (2006.01)
*H01L 27/32* (2006.01)
*H01L 29/786* (2006.01)
*G02F 1/1345* (2006.01)
*G02F 1/1368* (2006.01)

(52) U.S. Cl.
CPC .... *H01L 29/41733* (2013.01); *G02F 1/13454* (2013.01); *H01L 27/124* (2013.01); *H01L 27/1251* (2013.01); *H01L 27/3262* (2013.01); *H01L 29/78648* (2013.01); *G02F 1/1368* (2013.01); *H01L 27/1225* (2013.01)

(58) Field of Classification Search
CPC ............... H01L 27/3262; H01L 27/124; H01L 29/78648; H01L 29/41733; G02F 1/13454
See application file for complete search history.

(56) References Cited

U.S. PATENT DOCUMENTS

| 6,433,767 B1 * | 8/2002 | Murade ............... G02F 1/13454 345/92 |
| 6,433,841 B1 * | 8/2002 | Murade ............... G02F 1/13454 349/110 |
| 6,569,717 B1 * | 5/2003 | Murade ............. G02F 1/136213 438/149 |
| 9,147,719 B2 * | 9/2015 | Kim .................... H01L 27/1225 |
| 9,698,279 B2 * | 7/2017 | Kim .................... H01L 27/1225 |

(Continued)

FOREIGN PATENT DOCUMENTS

WO WO 2011/142147 A1 11/2011
WO WO 2012/020525 A1 2/2012

*Primary Examiner* — Errol V Fernandes
*Assistant Examiner* — Jeremy J Joy
(74) *Attorney, Agent, or Firm* — Oblon, McClelland, Maier & Neustadt, L.L.P.

(57) ABSTRACT

A display device including TFTs in a pixel area and in a peripheral driving area in which the number of through-holes in a TFT circuit is decreased, and the mounting density of the TFTs is improved, so that a high-resolution display can be achieved. The display device includes a display area in which pixels are disposed in a matrix form, and a TFT substrate, on which a peripheral driving circuit is disposed, on the outer side of the display area. The pixels or the peripheral driving circuit includes TFTs (thin film transistors) each of which is formed in such a way that a first gate electrode of each TFT is formed relative to a semiconductor layer with a first gate insulating film therebetween, and a drain electrode and a source electrode of each TFT that are connected to the semiconductor layer are formed at layers different from each other.

17 Claims, 14 Drawing Sheets

(56) References Cited

U.S. PATENT DOCUMENTS

| | | | |
|---|---|---|---|
| 2008/0149937 A1* | 6/2008 | Moriwaki | G02F 1/136227 257/72 |
| 2009/0121233 A1* | 5/2009 | Yasukawa | H01L 27/124 257/72 |
| 2009/0315457 A1* | 12/2009 | Furukawa | H01L 29/78603 313/504 |
| 2010/0182223 A1* | 7/2010 | Choi | G09G 3/3233 345/76 |
| 2012/0097955 A1* | 4/2012 | Wu | H01L 29/78618 257/59 |
| 2013/0200362 A1* | 8/2013 | Wang | H01L 29/7869 257/43 |
| 2013/0201420 A1* | 8/2013 | Misaki | H01L 29/7869 349/46 |
| 2013/0201610 A1* | 8/2013 | Yamasaki | H01L 27/1251 361/679.01 |
| 2015/0041799 A1* | 2/2015 | Morooka | H01L 29/7869 257/43 |
| 2015/0214248 A1* | 7/2015 | Chou | H01L 27/1225 257/40 |
| 2015/0380433 A1* | 12/2015 | Kim | H01L 29/7869 257/43 |
| 2016/0013326 A1* | 1/2016 | Sun | H01L 27/124 257/71 |
| 2016/0027873 A1* | 1/2016 | Chiang | H01L 29/458 257/66 |
| 2016/0064568 A1* | 3/2016 | Ishida | H01L 29/4975 257/43 |
| 2016/0087021 A1* | 3/2016 | Sato | H01L 27/3262 257/43 |
| 2016/0149052 A1* | 5/2016 | Ahn | H01L 27/3262 257/40 |
| 2016/0163745 A1* | 6/2016 | Choi | H01L 27/1251 257/40 |
| 2017/0005152 A1* | 1/2017 | Hong | H01L 29/78621 |
| 2017/0047361 A1* | 2/2017 | Xu | H01L 27/13 |
| 2017/0160613 A1* | 6/2017 | Wu | H01L 27/1288 |
| 2017/0220185 A1* | 8/2017 | Kurasawa | G06F 3/0446 |
| 2017/0294456 A1* | 10/2017 | Lee | H01L 27/1225 |
| 2018/0083076 A1* | 3/2018 | Hanada | H01L 27/1248 |
| 2018/0158406 A1* | 6/2018 | Kim | G09G 3/3283 |
| 2018/0286888 A1* | 10/2018 | Yamaguchi | H01L 29/786 |

* cited by examiner

DISPLAY DEVICE

CLAIM OF PRIORITY

The present application claims priority from Japanese Patent Application JP 2017-161138 filed on Aug. 24, 2017, the content of which is hereby incorporated by reference into this application.

TECHNICAL FIELD

The present invention relates to a high-resolution display device composed of thin film transistors that are high-densely formed.

BACKGROUND ART

In an organic EL display device, first thin film transistors are disposed as switching elements for pixels respectively (hereinafter, a thin film transistor is denoted by a TFT for short) in order to control the loadings of data signals, and the inflows of currents into light-emitting elements are controlled by second TFTs that functions as driving elements for light-emitting layers. In a liquid crystal display device, TFTs are disposed as switching elements for respective pixels, and the loadings of data signals are controlled by the TFTs. Furthermore, a driving circuit composed of TFTs is disposed on the periphery of the screen of the liquid crystal display device.

An organic EL display device or a liquid crystal display device is required to have a high-resolution screen, so that how to secure a space in which TFTs are disposed becomes problematic. Especially, in the organic EL display device, because plural TFTs are allocated to every pixel, how to secure a space for the disposition of the TFTs becomes a serious problem. In addition, as the screen becomes of higher resolution, the size of the driving circuit becomes larger, and therefore it becomes difficult to house the driving circuit in a limited space.

WO 2011/142147 discloses a configuration in which a bottom gate type TFT and a top gate type TFT are included in the same circuit board, and the source electrode or the drain electrode of the bottom gate type TFT and the gate electrode of the top gate type TFT are connected to each other without the intercalation of any other TFT. WO 2012/020525 discloses a configuration in which a source electrode of a TFT is directly layered on a semiconductor layer, and a drain electrode of the TFT is connected to the source electrode via a through-hole formed at an insulating film covering the semiconductor layer.

SUMMARY OF THE INVENTION

In an organic EL display device, because plural TFTs are disposed in one pixel, it becomes more difficult to dispose the plural TFTs as the screen of the display device becomes of higher resolution. Furthermore, because, in an organic EL display device or a liquid crystal display device, a driving circuit is disposed in the periphery of the display area of the display device, if the screen of the display device becomes of higher resolution and the number of TFTs becomes larger, it becomes more difficult to dispose a large number of TFTs in a limited space such as the periphery of the display area.

In other words, in the configuration of the related art, in order to connect TFTs to one another, it is necessary to form a large number of hard-wirings connected to one another via many through-holes. Because a through-hole requires a considerable space, it is difficult to increase the mounting density of TFTs. A problem to be solved by the present invention is how to form a configuration in which a required number of TFTs can be disposed in a limited space and how to realize a display device having a high-resolution display capability.

An object of the present invention is to provide some means for solving the above-mentioned problem. In other words, one of the means is to provide a configuration, in which the number of through-holes can be decreased by forming a layer where a semiconductor layer is connected to a drain electrode or a source electrode as an independent layer of the channel portion of the semiconductor layer, to each TFT. An alternative means is to realize a configuration in which the number of hard-wirings and the number of through-holes are decreased and the mounting density of TFTs can be increased by forming various types of TFTs at the same time. Main concrete means are as follows.

(1) A display device including a display area where pixels are disposed and a TFT substrate on which a driving circuit is disposed, in which the pixels or the driving circuit include TFTs each of which is formed in such a way that a first gate electrode of each TFT is formed relative to a semiconductor layer with a first gate insulating film therebetween, and a drain electrode and a source electrode of each TFT that are connected to the semiconductor layer are formed at layers different from each other.

(2) A display device including a display area where pixels are disposed and a TFT substrate on which a driving circuit is disposed, in which the pixels or the driving circuit includes: first TFTs each of which is formed in such a way that a first drain electrode and a first source electrode of each TFT that are connected to a first semiconductor layer are formed at layers different from each other; and second TFTs each of which is formed in such a way that a second drain electrode and a second source electrode of each TFT that are connected to a second semiconductor layer are formed at the same layer.

DESCRIPTION OF THE PREFERRED EMBODIMENTS

Hereinafter, the contents of the present invention will be explained in detail with the use of some embodiments. The contents of first and second embodiments explained mainly about organic EL display devices are also applicable to a third embodiment explained about a liquid crystal display device.

First Embodiment

Figure 1:
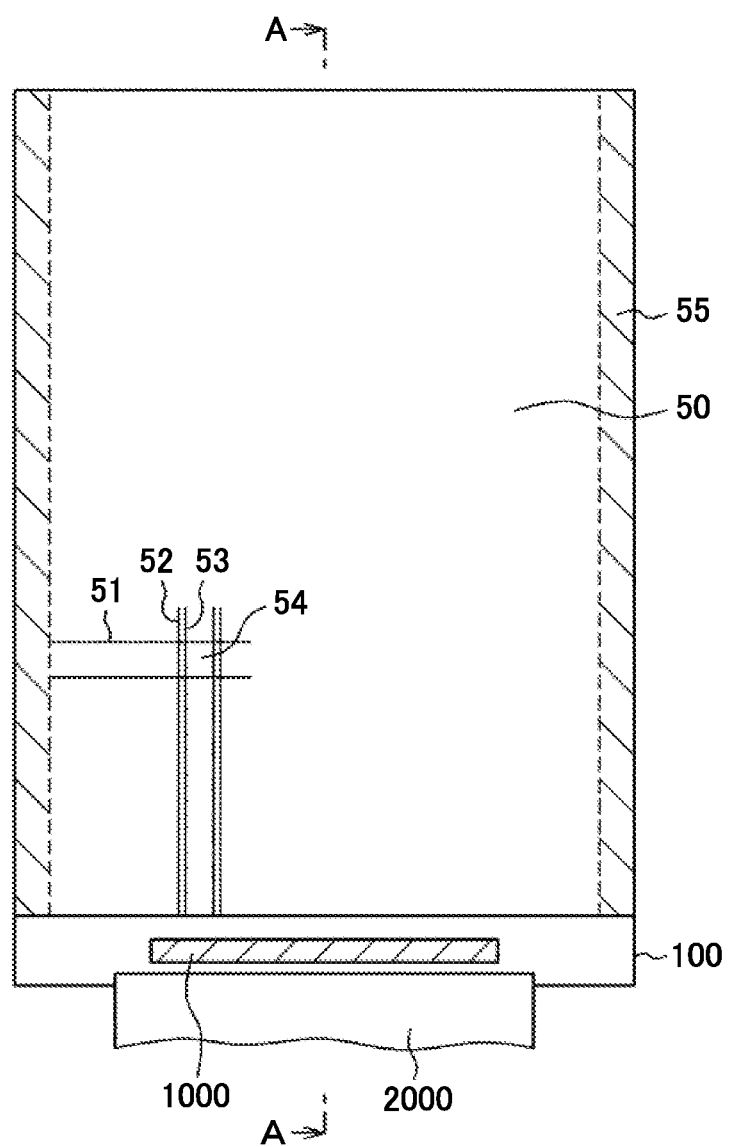
FIG. 1 is a plan view of an organic EL display device to which the present invention is applied.

FIG. 1 is a plan view of an organic EL display device to which the present invention is applied. In FIG. 1, scanning lines 51 extend in a lateral direction, and are arranged in a longitudinal direction respectively in a display area 50. Furthermore, pairs of image signal lines 52 and power supply lines 53 extend in the longitudinal direction and are arranged in the lateral direction respectively. Pixels 54 are disposed in areas surrounded by the scanning lines 51, the image signal lines 52, and the power supply lines 53.

A peripheral driving circuit 55 including a scanning line driving circuit and so on is disposed in the periphery of the display area 50. This driving circuit 55 includes TFTs. A driver IC 1000 for driving the image signal lines is mounted in a terminal unit on the outer side of the display area 50, and additionally a flexible wiring board 2000 for providing electric power and signals to the organic EL display device is connected to the organic EL display device.

Each pixel includes plural TFTs. In addition, the peripheral driving circuit 55 also includes a large number of TFTs. As the screen of the organic EL display device becomes of higher resolution, the number of TFTs becomes larger. Because TFTs are connected to hard-wires via through-holes in many cases, and the area of a through-hole hole is larger than the active area of a TFT, through-holes have become obstacles to the high-density arrangement of the TFTs.

Figure 2:
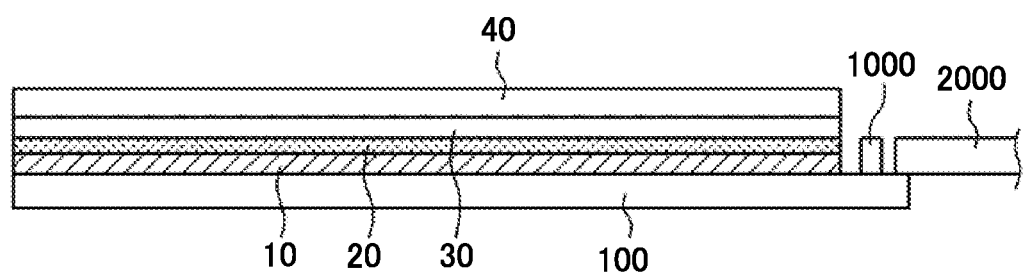
FIG. 2 is a cross-sectional view taken along the line A-A in FIG. 1.

FIG. 2 is a cross-sectional view of the organic EL display device taken along the line A-A in FIG. 1. In FIG. 2, a TFT circuit layer 10 including TFTs disposed in the pixels and the peripheral driving circuit is formed on a substrate 100. An organic EL array layer 20 including light-emitting layer is formed on the TFT circuit layer 10. A protective layer 30 for protecting an organic EL layer is formed on the organic EL array layer 20. A circular polarization plate 40 is pasted to the protective layer 30 in order to block reflection. In FIG. 2, the driver IC 1000 for driving the organic EL display device is mounted on the terminal unit on the outer side of the display area, and the flexible wiring board 2000 for providing electric power and signals to the organic EL display device is connected to the terminal unit.

Figure 3:
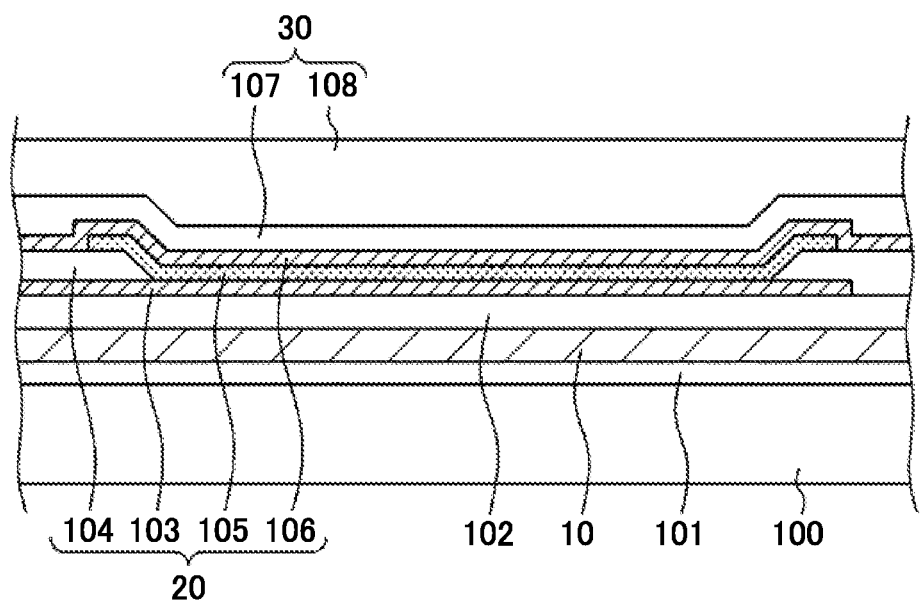
FIG. 3 is a cross-sectional view of a pixel unit of the organic EL display device.

FIG. 3 is a more detailed cross-sectional view of a pixel unit of the organic EL display device. FIG. 3 shows that an undercoat 101 composed of silicon nitride (hereinafter referred to as SiN) or oxide silicon (hereinafter referred to as SiO) is formed on the substrate 100. The TFT circuit layer 10 is disposed on the substrate 101. A planarizing film 102 is disposed on the TFT circuit layer 10, and a lower electrode 103 for an organic EL layer is formed on the planarizing film 102. The lower electrode 103 constitutes a cathode, and at the same time plays a role as a reflection electrode.

A bank 104, which is made of an organic material such as an acrylic, is formed in the periphery of the pixels. An organic EL layer 105 is formed on the inner side of the bank 104 as a light-emitting layer. The bank 104 prevents the organic EL layer 105 from steppedly being cut. An upper electrode 106 is formed over the organic EL layer 105. The upper electrode 106 plays a role of a cathode and it is composed of a transparent oxide conductive film such as an ITO film or an IZO film, or a thin film made of a metal such as silver or an alloy. In the present specification, a structure composed of the lower electrode 103 to the upper electrode 106 will be referred to as the organic EL array layer 20.

A first protective film 107 composed of an inorganic film such as an SiN film or an SiO film is formed so as to cover the upper electrode 106, and a second protective film 108 composed of a transparent organic material is formed over the first protective film 106. There are some kinds of organic EL display devices each of which has a third protective film composed of an inorganic film over its second protective film 108. In the present specification, a combination of the first protective film 107, the second protective film 108, and the like will be referred to as the protective layer 30. In FIG. 3, the circular polarization plate is omitted.

Figure 4:
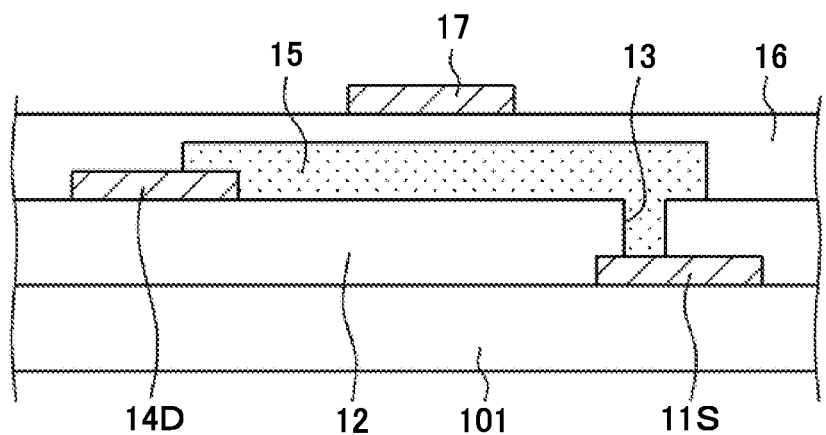
FIG. 4 is a cross-sectional view of a TFT used in a first embodiment.

FIG. 4 is a cross-sectional view showing one aspect of a TFT according to the present invention. Hereinafter, in the descriptions about the present invention, it will be assumed that a semiconductor layer 15 is an oxide semiconductor, but it is also conceivable that the semiconductor layer 15 is a polysilicon semiconductor or an a-Si (amorphous silicon). FIG. 4 shows that a source electrode 11S is formed at a first electrode layer on an undercoat 101, and a first interlayer insulating film 12 is formed on the source electrode 11S. The first interlayer insulating film 12 is formed by a single-layer inorganic film or a multi-layer inorganic film that is composed of SiO, SiN, or the like. However, a layer that has contact with the oxide semiconductor layer 15 has to be composed of SiO.

A through-hole 13 is formed at the first interlayer insulating film 12. Due to the through-hole 13, the electrode 11S formed at the first electrode layer can be made the source electrode of the TFT. Next, a second electrode layer 14D is formed on the first interlayer insulating film 12. The second electrode layer 14D functions as a drain electrode of the TFT. Subsequently, a semiconductor layer 15 is formed so as to cover a part of the first interlayer insulating film 12 and a part of the drain electrode 14D. The semiconductor layer 15 is composed of an oxide semiconductor. The oxide semiconductor layer 15 extends so as to fill the inside of the through-hole 13, and makes contact with the source electrode 11S formed at the first electrode layer.

Successively, a second interlayer insulating film 16 is formed so as to cover a part of the second electrode layer 14D, parts of the first interlayer insulating film 12, and the semiconductor layer 15. The second interlayer insulating film 16 is formed by a single-layer inorganic film or a multi-layer inorganic film that is composed of SiO, SiN, or the like. However, a layer that has contact with the oxide semiconductor layer 15 has to be composed of SiO. A gate electrode 17 is formed at a third electrode layer on the second interlayer insulating film 16. As described later, ion implantation is performed on the semiconductor layer 15 except for a part of the area covered by the gate electrode 17 in the case of the second interlayer insulating film 16 being viewed from the top, and the second interlayer insulating film 16 is doped with phosphorus, boron, or the like, so that electrical conductivity is given to the semiconductor layer 15. Here, the second interlayer insulating film 16 functions as a gate insulating film.

A feature shown in FIG. 4 lies in the point that, although the semiconductor layer 15 is connected to the drain electrode 14D at the same layer, the semiconductor layer 15 is connected to the source electrode 11S, which is formed at the first electrode layer, at another layer via the through-hole 13. In FIG. 4, the semiconductor layer 15 itself protrudes into the inside of the through-hole 13 to be connected to the source electrode 11S. It is preferable that the taper angle of the through-hole 13 should be 60 degrees or smaller lest the semiconductor layer 15 should be steppedly cut in the middle of the through-hole 13.

Figure 5:
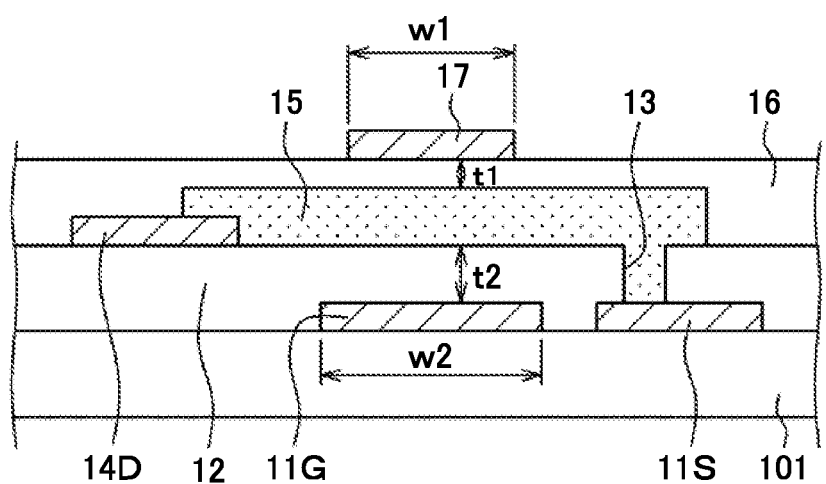
FIG. 5 is a cross-sectional view of another TFT used in the first embodiment.

FIG. 5 shows the cross-sectional view of a TFT according to another aspect of the present invention. FIG. 5 is different from FIG. 4 in that a second gate electrode 11G is formed at a first electrode layer on an undercoat 101 in FIG. 5. In other words, FIG. 5 shows a double-gate structure in which a gate electrode 17 and a gate electrode 11G are disposed over and below a semiconductor layer 15 respectively. Furthermore, a first interlayer insulating film 12 functions as a gate insulating film. In FIG. 5, a distance t2 between the second gate electrode 11G and the semiconductor layer 15 is larger than a distance t1 between the first gate electrode 17 and the semiconductor layer 15. For example, t1 is 100 nm, while t2 is 200 nm. On the other hand, the width w2 of the second gate electrode 11G is larger than the width w1 of the first gate electrode 17. The width w2 is made larger than the width w1 because the second gate electrode 11G requires more accurate mask alignment. Here, the widths w1 and w2 can be respectively rephrased as the widths of the gate electrodes in a direction the drain portion and the source portion are facing to each other. The relationship between the distances t1 and t2, or the relationship between the widths w1 and w2 is determined by the magnitudes of the functions of the first gate electrode 17 and the second gate electrode 11G, and by how to make the relationship between the capacities of the gate electrodes 17, 11G and the source electrode 11S or the drain electrode 14D.

Figure 6:
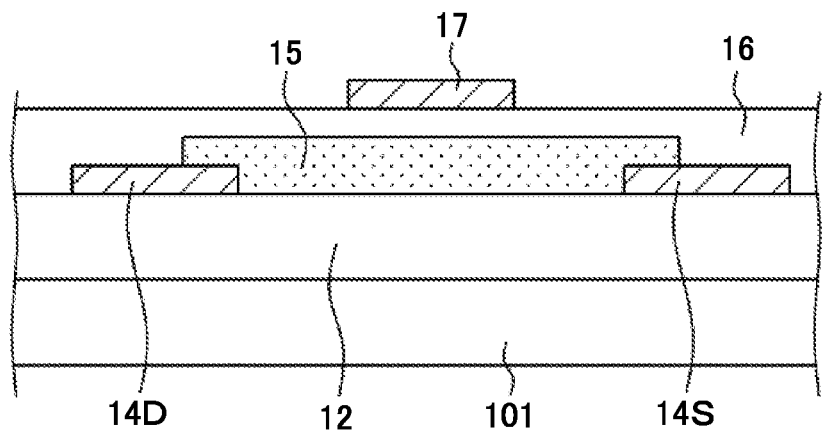
FIG. 6 is a cross-sectional view of another TFT used in the first embodiment.

FIG. 6 shows the cross-sectional view of a TFT according to another aspect of the present invention. In FIG. 6, a drain electrode 14D and a source electrode 14S are formed at a second electrode layer on a first interlayer insulating film 12, and a semiconductor layer 15 is formed so as to cover parts of these electrodes. A second interlayer insulating film 16 is formed so as to cover the semiconductor layer 15. A gate electrode 17 is formed at a third electrode layer on the second interlayer insulating film 16. In this case, the second interlayer insulating film 16 functions as a gate insulating film. A feature shown in FIG. 6 lies in the fact that both drain electrode 14D and source electrode 14S of the TFT have directly contact with the lower side of the semiconductor layer 15.

Figure 7:
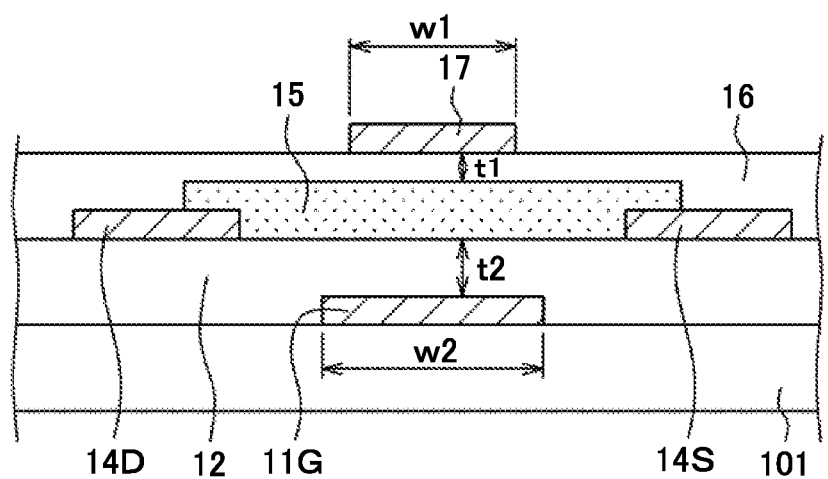
FIG. 7 is a cross-sectional view of another TFT used in the first embodiment.

FIG. 7 shows the cross-sectional view of a TFT according to another aspect of the present invention. FIG. 7 is different from FIG. 6 in that a second gate electrode 11G is formed at a first electrode layer on an undercoat 101 in FIG. 7. The relationship between distances t1 and t2 and the relationship between widths w1 and w2 in FIG. 7 are the same as the relationship between the distances t1 and t2 and the relationship between the widths w1 and w2 explained in FIG. 5.

Figure 8:
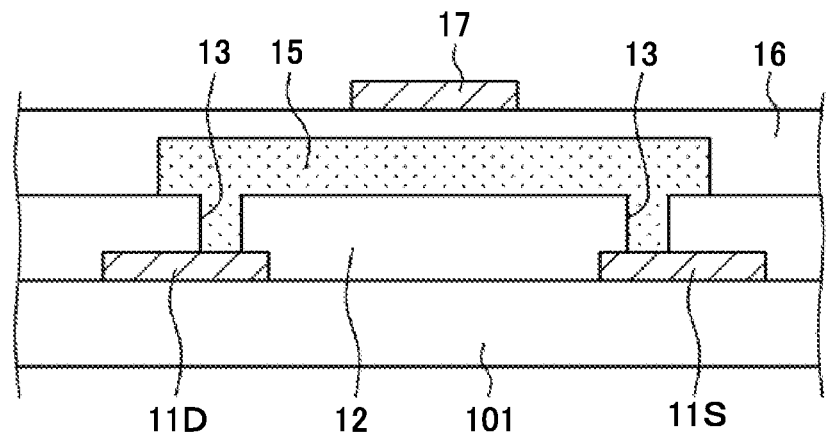
FIG. 8 is a cross-sectional view of another TFT used in the first embodiment.

FIG. 8 shows the cross-sectional view of a TFT according to another aspect of the present invention. In FIG. 8, a drain electrode 11D and a source electrode 11S are formed at a first electrode layer on an undercoat 101. A first interlayer insulating film 12 is formed so as to cover the first electrode layer, and a semiconductor layer 15 is formed on the first interlayer insulating film 12. The semiconductor layer 15 makes contact with the drain electrode 11D and the source electrode 11S via through-holes 13 respectively. Subsequently, a second interlayer insulating film 16 is formed so as to cover the semiconductor layer 15, and a gate electrode 17 is formed at a third electrode layer on the second interlayer insulating film 16. The second interlayer insulating film 16 functions as a gate insulating film.

Ion implantation is performed with the gate electrode 17 used as a mask, and electrical conductivity is given to the semiconductor layer 15 except for the channel of the semiconductor layer 15. A feature shown in FIG. 8 lies in the fact that the semiconductor layer 15 is connected to the drain electrode 11D and the source electrode 11S at the first electrode layer disposed below the semiconductor layer 15. In other words, the semiconductor layer 15 extends so as to fill the insides of the through-holes 13, and has directly contact with the drain electrode 11D and the source electrode 11S.

Figure 9:
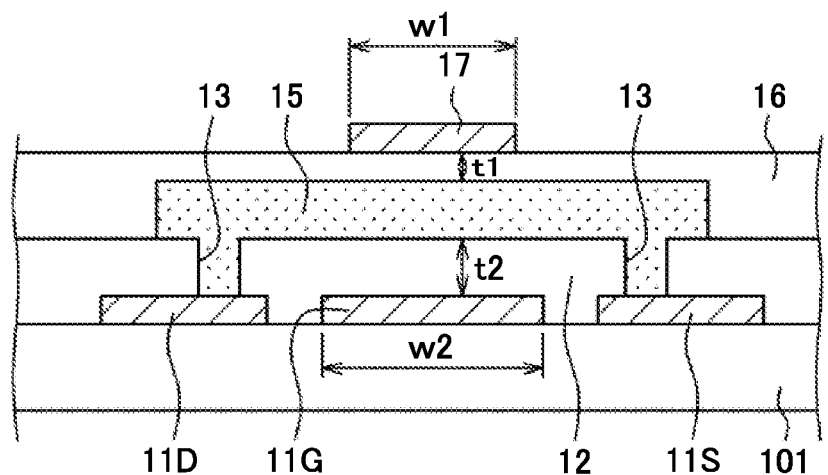
FIG. 9 is a cross-sectional view of another TFT used in the first embodiment.

FIG. 9 shows the cross-sectional view of a TFT according to another aspect of the present invention. FIG. 9 is different from FIG. 8 in that a second gate electrode 11G is formed at a first electrode layer in FIG. 9. Accordingly, the TFT shown in FIG. 9 is a double-gate TFT. The relationship between distances t1 and t2 and the relationship between widths w1 and w2 in FIG. 9 are the same as the relationship between the distances t1 and t2 and the relationship between the widths w1 and w2 explained in FIG. 5.

As described above, in the present invention, a high-resolution screen can be realized by forming combinations of various types of TFTs, decreasing the number of through-holes, and increasing the forming density of TFTs. One of the features of the structure of each of the TFTs that have been described above lies in the point that a layer at which the semiconductor layer of each TFT has contact with the drain electrode and a layer at which the semiconductor layer has contact with the source electrode are different from each other. In addition, another feature of the structure of each TFT according to the present invention lies in the point that the semiconductor layer of each TFT directly makes contact with the drain electrode or the source electrode. Furthermore, another feature lies in the point that the number of hard-wires and the number of through-holes are decreased by using various types of TFTs each of which has a connection configuration for connecting its semiconductor layer to its drain electrode and source electrode are different from each other.

Figure 10:
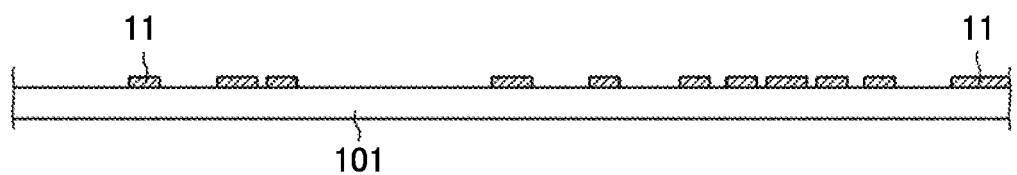
FIG. 10 is a cross-sectional view showing a part of a process in which TFTs shown in FIG. 4 to FIG. 10 are formed all at once.

FIG. 10 to FIG. 17 are cross-sectional views showing an example of a series of processes in which the TFTs explained in FIG. 4 to FIG. 9 are formed on the same board. FIG. 10 shows that first electrode layers 11 are formed on an undercoat 101 formed on a TFT substrate. It is possible that the first electrode layers 11 become any of a gate electrode, a drain electrode, and a source electrode depending on how the first electrode layers 11 are connected to semiconductor layers formed later. Here, in FIG. 10, one of the first electrode layers 11 that is wider and formed on the right side shows an example of a set of hard-wirings among TFTs.

a material of the first electrode layers 11, a single-layer film made of a metal of Ti, or Mo, an alloy of MoW, a laminated layer film made of Al/Ti, or the like that is formed with its thickness 50 to 200 nm is used, for example. These materials are formed by sputtering or CVD, and patterned by photolithography. As etching, dry etching is used many times, but wet etching can also be used. In the case where wet etching is used, a Cu/Ti laminated layer film or the like is used as a material for the first electrode layers 11.

Figure 11:
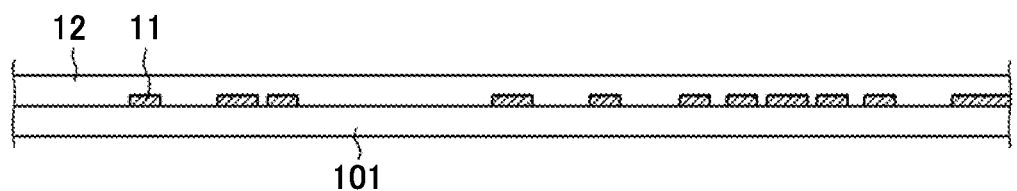
FIG. 11 is a cross-sectional view showing another part of the process in which TFTs shown in FIG. 4 to FIG. 10 are formed all at once.

FIG. 11 is a cross-sectional view showing a state in which a first interlayer insulating film 12 is formed so as to cover the first electrode layers 11. The first interlayer insulating film 12 is made of SiO formed by plasma CVD using $SiH_4+N_2O$ as materials. As a material for the first interlayer insulating film 12, an SiN/SiO laminated layer film can be used instead of the SiO single-layer film. In this case, a film that has contact with the oxide semiconductor layer 15 has to be the SiO film of the SiN/SiO laminated layer film. This is because SiN deoxidizes the oxide semiconductor and destabilizes the characteristics of each of the TFTs. The thickness of the first interlayer insulating film 12 is 80 nm to 150 nm.

Figure 12:
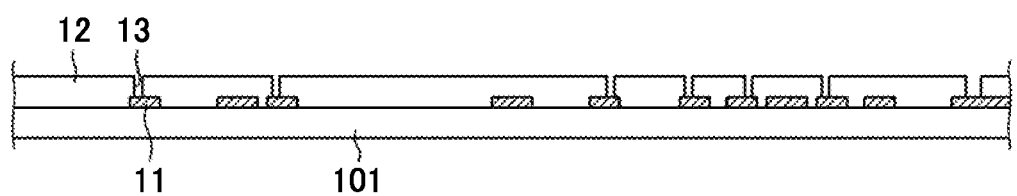
FIG. 12 is a cross-sectional view showing another part of the process in which TFTs shown in FIG. 4 to FIG. 10 are formed all at once.

FIG. 12 is a cross-sectional view showing a state in which through-holes 13 are formed at the first interlayer insulating film 12. The through-holes 13 are formed by dry etching using photolithography. The through-holes 13 are used for the TFTs.

Figure 13:
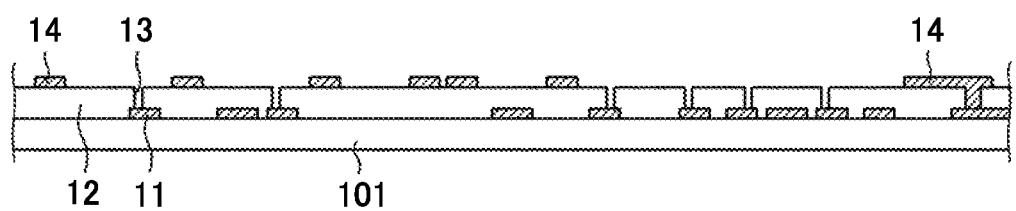
FIG. 13 is a cross-sectional view showing another part of the process in which TFTs shown in FIG. 4 to FIG. 10 are formed all at once.

FIG. 13 is a cross-sectional view showing a state in which second electrode layers 14 are formed on the first interlayer insulating film 12. As a material for the second electrode layers 14, MoW, Ti, W, or the like is used, and the thickness of the material is 50 nm to 200 nm. These materials are deposited by sputtering or CVD, photolithography is performed on these materials, and these materials are patterned by dry etching. Here, each of the electrodes of the second electrode layers 14 can be a single-layer electrode or a multi-layer electrode. As an example of the multi-layer electrode, an electrode having a three-layer structure composed of Ti/Al/Ti can be cited.

At any rate, it is necessary to use a material for the second electrode layers 14 that makes it possible to set an appropriate etching selection ratio between the material for the second electrode layers 14 and the material for the first electrode layers 11. For example, if Ti is used for the first electrode layers 11, it is necessary to use MoW or W for the second electrode layers 14. In addition, because semiconductor layers 15 are formed so as to cover some of the second electrode layers 14 and the through holes, it is important to provide tapering to the though holes to prevent the semiconductor layers 15 to avoid disconnection by step. The taper angle of the tapering is, for example, 60 degrees.

Figure 14:
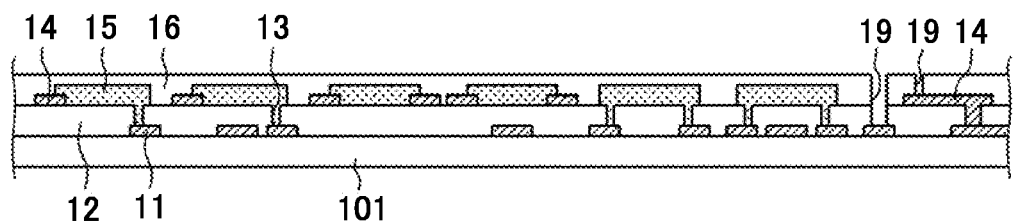
FIG. 14 is a cross-sectional view showing another part of the process in which TFTs shown in FIG. 4 to FIG. 9 are formed all at once.

FIG. 14 is a cross-sectional view showing a state in which the semiconductor layers 15 are formed so as to cover parts of the first interlayer insulating film 12 and parts of some of the first electrode layers 11, and successively a second interlayer insulating film 16 is formed. The semiconductor layers 15 are made of an oxide semiconductor, and for example, IGZO (indium gallium zinc oxide) is used for the oxide semiconductors. Other kinds of oxide semiconductors such as ITZO (indium tin zinc oxide), ZnON (zinc oxide nitride), and IGO (indium gallium oxide) can also be used. Alternatively, Poly-Si (polysilicon) or a-Si (amorphous silicon) can be used for the semiconductor layers 15.

Reactive sputtering is performed on the semiconductor layers 15 under an $Ar+O_2$ atmosphere so that the semiconductor layers 15 are deposited with their thickness about 30 nm to 70 nm. Subsequently, photolithography is performed on the semiconductor layers 15, and the semiconductor layers 15 are patterned by using etching. Wet etching is performed as etching in many cases. Successively, the semiconductor layers 15 are annealed in a 350° C. atmosphere.

Subsequently, the second interlayer insulating film 16 is formed under the condition of the relevant board temperature 200° C. to 250° C. by plasma CVD using $SiH_4+N_2O$ as materials. The thickness of the second interlayer insulating film 16 is 80 nm to 150 nm. Successively, the second interlayer insulating film 16 is annealed in a 300° C. atmosphere.

Afterward, through-holes 19 are formed at the second interlayer insulating film 16 in a wiring area residing on the right side of FIG. 14. The through-holes 19 are through-holes used for wiring. The through-holes 19 are used for connecting various types of TFTs as needed. The through-holes are formed by executing photolithography and dry etching. Photolithography is executed on the through-holes, and the through holes are formed by dry etching.

Figure 15:
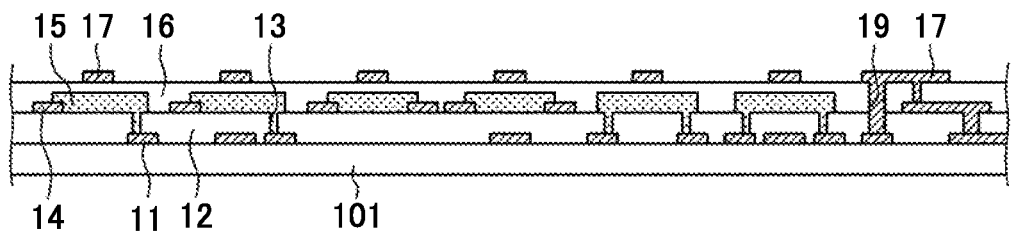
FIG. 15 is a cross-sectional view showing another part of the process in which TFTs shown in FIG. 4 to FIG. 9 are formed all at once.

FIG. 15 is a cross-sectional view showing a state in which third electrode layers 17 are formed on the second interlayer insulating film 16. Third electrode layers 17 provided to TFTs become the gate electrodes of the TFTs. The third electrode layers 17 is formed by depositing a single-layer film made of a metal of Ti, or W, an alloy of MoW, a laminated layer film made of Ti/Al/Ti, or the like by sputtering or CVD. Subsequently, photolithography is executed on the third electrode layers 17, and the third electrode layers 17 is patterned by dry etching. Here, hard-wirings shown on the right side of FIG. 15 are completed by patterning a third electrode layer 17 residing on the right side.

Figure 16:
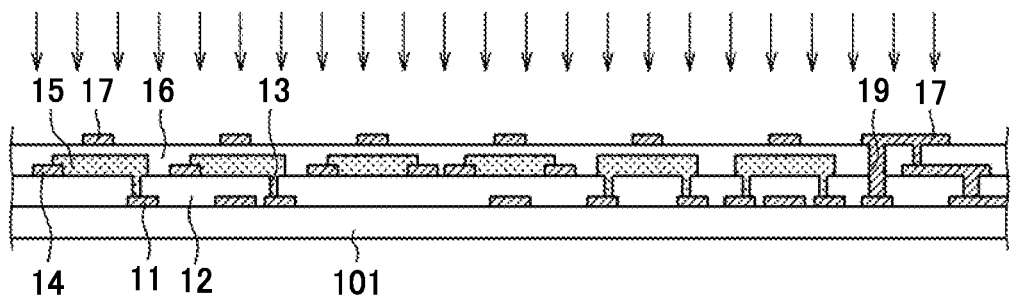
FIG. 16 is a cross-sectional view showing another part of the process in which TFTs shown in FIG. 4 to FIG. 9 are formed all at once.

In the case where the semiconductor layers are made of silicon, as shown by the cross-sectional view of FIG. 16, phosphor (P), boron (B), or the like is implanted into the semiconductor layers by ion implantation using the gate electrodes formed at the third electrode layers 17 as masks, so that electrical conductivity is given to the semiconductor layers 15 except for channel layers. The ion doping density obtained by executing the ion implantation is about $5 \times 10^{14}/cm^2$, and if the ion doping density is converted into a volume density, it is about $10^{18}$ to $10^{19}/cm^3$.

If the semiconductor layers 15 are oxide semiconductors, the drain portions and source portions of the TFTs can be given electrical conductivity by the following way instead of the ion implantation. In other words, the second interlayer insulating film 16 is removed using the third electrode layers 17 as masks. Subsequently, the oxide semiconductor layers 15 are exposed to a deoxidizing atmosphere while being heated. As a result, oxygen is removed from the oxide semiconductor layers 15, so that the oxide semiconductor layers 15 are given electrical conductivity. This annealing process can be executed in the same chamber in which the next process, that is, the formation of a third interlayer insulating film 18 is executed.

Figure 17:
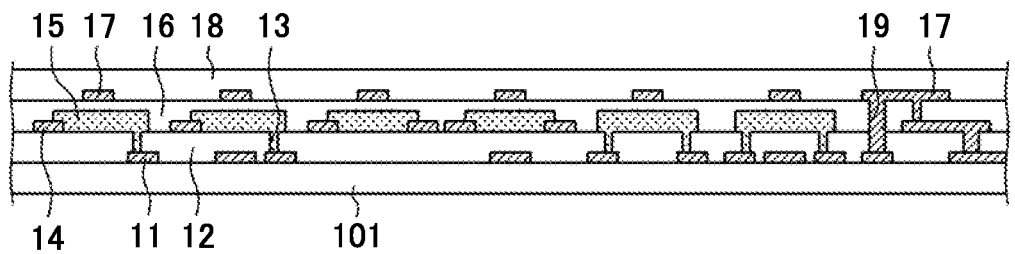
FIG. 17 is a cross-sectional view showing another part of the process in which TFTs shown in FIG. 4 to FIG. 9 are formed all at once.

FIG. 17 is a cross-sectional view showing a state in which third interlayer insulating film 18 is formed so as to cover the third electrode layers 17. Because the third interlayer insulating film 18 protects the entirety of the TFTs, it is often referred to as a passivation film. As the third interlayer insulating film 18, an SiN film with its thickness about 100 to 300 nm, or an SiO/SiN laminated layer film with its thickness about 100 to 300 nm is formed by CVD under the condition of the relevant board temperature 250° C.

As another structure of the third interlayer insulating film 18, conceivable is a structure that is obtained, for example, by forming an alumina film (hereinafter, referred to as an AlO film) with its thickness about 50 nm under the condition of the board temperature about 150° C. by reactive sputtering using $Ar+O_2$ gas after an SiO film is formed under the condition of the relevant board temperature about 250° C. by CVD.

As shown in FIG. 17, all the TFTs explained in FIG. 4 to FIG. 9 can be formed in the same processes. In addition, in the case where TFTs of the same number are formed, the necessary number of through-holes is drastically decreased in FIG. 17. Furthermore, by combining various types of TFTs, it becomes possible to dispose many TFTs in a small space. In addition, as shown on the right side of FIG. 17, necessary hard-wirings can be laid out in the most spatially efficient place.

Figure 18:
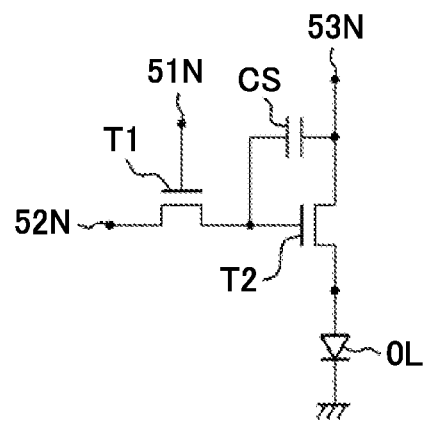
FIG. 18 is a driving circuit of a pixel unit of the organic EL display device.

FIG. 18 shows an example of a driving circuit for a pixel. T1 denotes a selection transistor, T2 denotes a driving transistor, CS denotes a storage capacitor, and OL denotes an organic EL layer. In FIG. 18, a node 51N is connected to a scanning line, a node 52N is connected to an image signal line, and a node 53N is connected to a power supply line. The driving transistor T2 and the organic EL layer OL are connected in series between the node 53N and the ground.

If a scanning signal is applied to the node 51N, T1 is turned on, and an image signal flows in from the node 52N, so that the electric charge of the image signal is stored in the storage capacitor CS. The driving transistor T2 provides a current from a power supply to the organic EL layer OL in accordance with a gate voltage that depends on the electric charge stored in the storage capacitor ST. In other words, the light emitting of the organic EL layer is controlled by the image signal.

At this time, because the smaller parasitic capacitor the selection transistor T1 has, the more effectively a signal can be written in, it is advantageous to use any of single-gate TFTs shown in FIG. 4, FIG. 6, FIG. 8 among TFTs explained in FIG. 4 to FIG. 9, and the like as the selection transistor T1.

Figure 19:
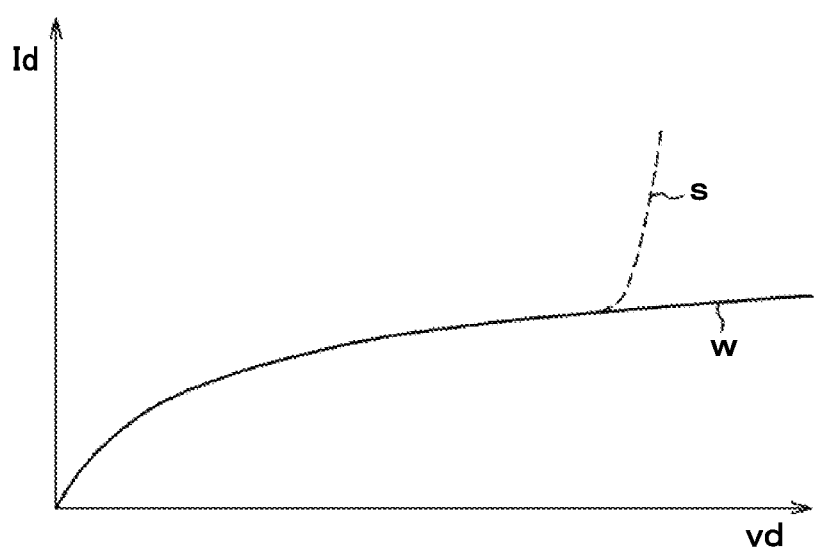
FIG. 19 is a graph showing a difference between the characteristic of a single-gate TFT and that of a double-gate TFT.

On the other hand, the driving transistor T2 needs to have current driving capability. Therefore, it is necessary that the driving transistor T2 has a high drain withstand voltage. In other words, the driving transistor T2 needs to be a TFT free of an avalanche. An avalanche is a phenomenon shown by S in FIG. 19. FIG. 19 shows a voltage-current characteristic of a TFT. The horizontal axis represents a drain voltage Vd of the TFT, and the vertical axis represents a drain current Id of the TFT.

As shown in FIG. 19, the current Id gradually increases along with the increase of the voltage Vd. However, when the voltage Vd reaches a certain value, a big difference arises between the characteristic of a single-gate TFT and that of a double-gate TFT. A curve S shown in FIG. 19 shows the characteristic of a single-gate TFT, and the current of the single-gate TFT drastically increases due to the avalanche effect of the single-gate TFT. On the other hand, such a phenomenon does not occur in the case of a double-gate TFT. Therefore, it is advantageous that the double-gate TFT is used as the driving transistor T2. Furthermore, it is not a big problem that the driving transistor T2 has a parasitic capacitor.

As described above, according to the present invention, by appropriately combining various types of TFTs, the most spatially efficient disposition of these TFTs can be achieved, and at the same time, TFTs having various characteristics can be disposed at the most appropriate place in accordance with the capabilities of the respective TFTs.

Second Embodiment

FIG. 20 to FIG. 23 are cross-sectional views showing the features of TFTs used in a second embodiment. The structures of the TFTs shown in FIG. 20 to FIG. 23 are different from the structures of TFTs according to the first embodiment in that a semiconductor layer 15 is formed before a second electrode layer 14D is formed. The materials and film thicknesses of a first electrode layer, the second electrode layer, a third electrode layer, a first interlayer insulating film, a second interlayer insulating film, and the like are the same as those described in the first embodiment.

Figure 20:
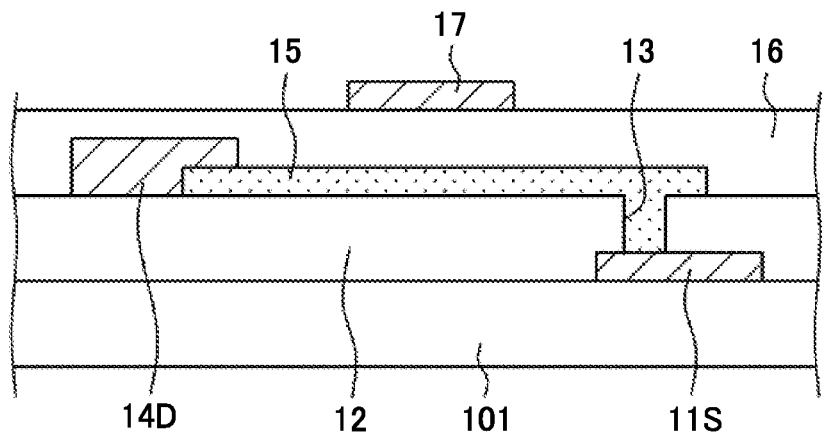
FIG. 20 is a cross-sectional view of a TFT used in a second embodiment.

In FIG. 20, the first electrode layer, which will be a source electrode 11S, is formed on an undercoat 101, the first interlayer insulating film 12 is formed so as to cover the first electrode layer, and a through-hole 13 is formed at the first interlayer insulating film 12. The semiconductor layer 15 is formed on the first interlayer insulating film 12. The semiconductor layer 15 is composed of an oxide semiconductor that is the same as described in the first embodiment. The semiconductor layer 15 extends so as to fill the inside of the through-hole 13, and makes contact with the source electrode 11S. The other end portion of the semiconductor layer 15 is covered with the second electrode layer which will be a drain electrode 14D.

When the oxide semiconductor layer 15 makes contact with a metal, oxygen is removed from the oxide semiconductor layers 15, so that the oxide semiconductor layers 15 are given electrical conductivity. The second interlayer insulating film 16 is formed so as to cover the semiconductor layer 15 and the second electrode layer 14D. A gate electrode 17 is formed at the third electrode layer on the second interlayer insulating film 16. FIG. 20 is different from FIG. 4 in that, in FIG. 20, the semiconductor layer 15 is formed before the second electrode layer 14 is formed, and the lower portion of the second electrode layer 14, which will be the drain electrode 14D, has contact with the semiconductor layer 15.

Figure 21:
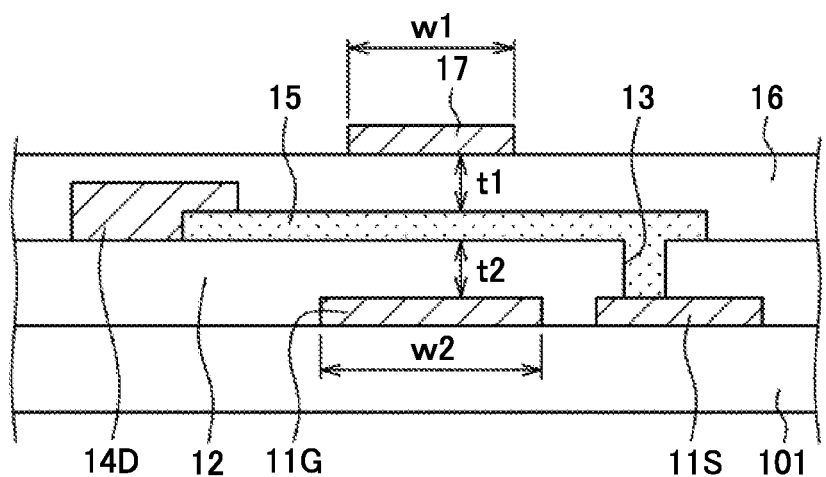
FIG. 21 is a cross-sectional view of another TFT used in the second embodiment.

FIG. 21 is a cross-sectional view showing another aspect of a TFT according to the second embodiment. The TFT shown in FIG. 21 is different from the TFT shown in FIG. 20 in that a gate electrode 11G is formed at a first electrode layer, so the TFT shown in FIG. 21 is a double-gate TFT. The relationship between distances t1 and t2 and the relationship between widths w1 and w2 in FIG. 21 are the same as the relationship between the distances t1 and t2 and the relationship between the widths w1 and w2 explained in FIG. 5.

Figure 22:
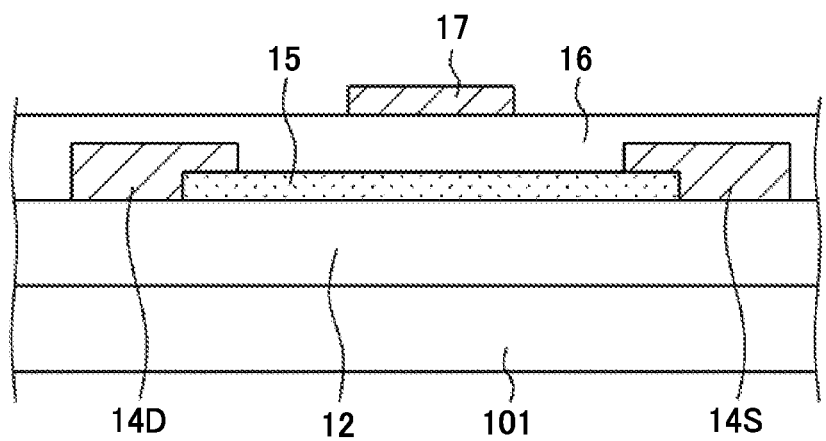
FIG. 22 is a cross-sectional view of another TFT used in the second embodiment.

FIG. 22 is a cross-sectional view showing another aspect of a TFT according to the second embodiment. The TFT shown in FIG. 22 is different from the TFT shown in FIG. 6 according to the first embodiment in that a semiconductor layer 15 on a first interlayer insulating film 12 before a first electrode layer 14D is formed. The semiconductor layer 15 is composed of an oxide semiconductor that is the same as described in the first embodiment. In FIG. 22, a drain electrode 14D is formed at the second electrode layer 16 so as to cover one end of the semiconductor layer 15 that has been patterned, and a source electrode 14S is formed at the second electrode layer so as to cover the other end of the semiconductor layer 15.

In FIG. 22, a second interlayer insulating film 16 is formed so as to cover the semiconductor layer 15, the drain electrode 14D, and the source electrode 14S. A gate electrode 17 is formed at a third electrode layer on the second interlayer insulating film 16.

Figure 23:
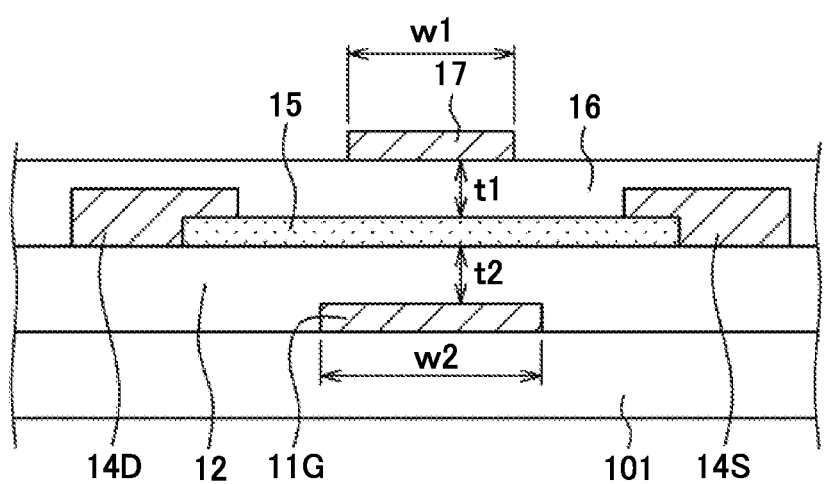
FIG. 23 is a cross-sectional view of another TFT used in the second embodiment.

FIG. 23 is a cross-sectional view showing another aspect of a TFT according to the second embodiment. The TFT shown in FIG. 23 is different from the TFT shown in FIG. 22 in that a second gate electrode 11G is formed at a first electrode layer on an undercoat 101. In other words, the TFT shown in FIG. 23 is a double-gate TFT. The relationship between distances t1 and t2 and the relationship between widths w1 and w2 in FIG. 23 are the same as the relationship between the distances t1 and t2 and the relationship between the widths w1 and w2 explained in FIG. 5 in the first embodiment.

Figure 24:
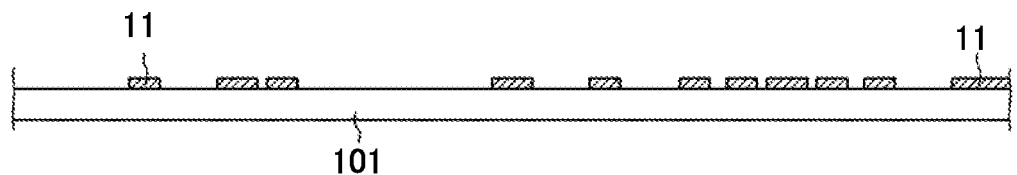
FIG. 24 is a cross-sectional view showing a part of a process in which various types of TFTs used in the second embodiment are formed all at once.

FIG. 24 to FIG. 30 are cross-sectional views showing an example of a series of processes in which various types of TFTs including the TFTs explained in FIG. 20 to FIG. 23 are formed on the same board. In FIG. 24, an electrode and hard-wirings shown on the right side show an example of a set of hard-wirings among TFTs. FIG. 24 shows an example that first electrode layers 11 are formed on an undercoat 101 formed on a TFT substrate. This process is the same as the process explained in FIG. 10.

Figure 25:
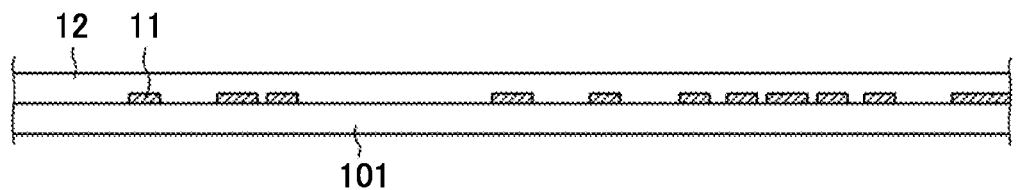
FIG. 25 is a cross-sectional view showing a part of a process in which various types of TFTs used in the second embodiment are formed all at once.

FIG. 25 is a cross-sectional view showing a state in which a first interlayer insulating film 12 is formed so as to cover the first electrode layers 11. The process shown in FIG. 25 is the same as the process shown in FIG. 11 explained in the first embodiment.

Figure 26:
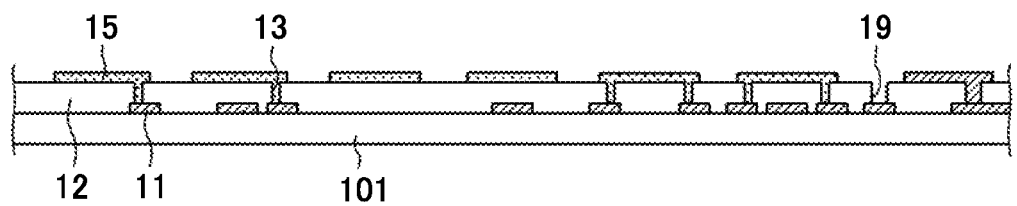
FIG. 26 is a cross-sectional view showing a part of a process in which various types of TFTs used in the second embodiment are formed all at once.

FIG. 26 is a cross-sectional view showing a state in which semiconductor layers 15 are formed on the first interlayer insulating film 12. This process is different from the process shown in the first embodiment. Although the second electrode layer is formed before the semiconductor layers 15 are formed in the first embodiment, the semiconductor layers 15 are formed first in the second embodiment. As the material of the semiconductor layers 15 in this embodiment, an oxide semiconductor that is the same as described in the first embodiment is used. In FIG. 26, through-holes 13 and a through-hole 19 are formed first so that parts of the first electrode layers 11 can be used as drain electrodes or source electrodes. At the same time, a through-hole 19 for wiring is also formed.

In FIG. 26, the oxide semiconductor layers 15 are deposited by sputtering, and the deposited oxide semiconductor layers 15 are patterned. The sputtering process and the patterning process are the same as those explained in FIG. 14. In FIG. 26, as is the case with FIG. 14, some of the semiconductor layers 15 extend so as to fill the inside of the through-holes 13, and directly make contact with drain electrodes or source electrodes.

Figure 27:
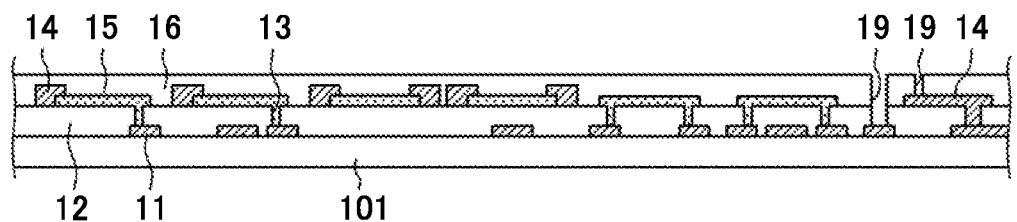
FIG. 27 is a cross-sectional view showing a part of a process in which various types of TFTs used in the second embodiment are formed all at once.

FIG. 27 is a cross-sectional view showing a state in which second electrode layers 14 cover parts of one sides of some of the semiconductor layers 15, and the drain electrodes or the source electrodes are formed using the second electrode layers 14. The material, the forming method, and the patterning method of the second electrode layers 14 are the same as those explained in FIG. 13 in the first embodiment. In FIG. 27, parts of some of the semiconductor layers 15 are covered by some of the second electrode layers 14, and oxygen is removed from these parts covered by some of the second electrode layers 14 due to metal included in the second electrode layers 14, so that the parts of some of the semiconductor layers 15 covered by some of the second electrode layers 14 are given electrical conductivity. Subsequently, a second interlayer insulating film 16 is formed so as to cover the semiconductor layers 15 and the second electrode layers 14. Subsequently, in FIG. 27, through-holes 19 are formed at the first interlayer insulating film 12 and at the second interlayer insulating film 16 for hard-wirings on the right side.

Figure 28:
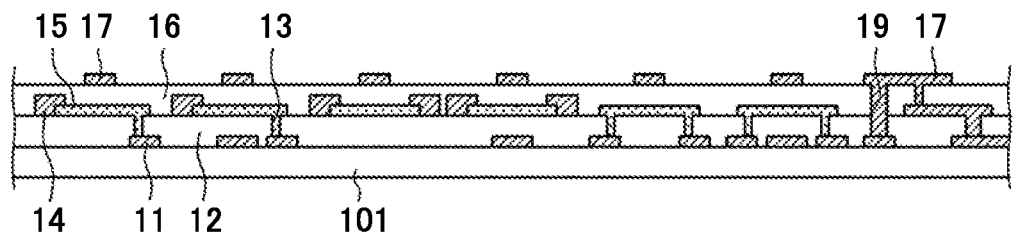
FIG. 28 is a cross-sectional view showing a part of a process in which various types of TFTs used in the second embodiment are formed all at once.

FIG. 28 is a cross-sectional view showing a state in which gate electrodes are formed at the third electrode layers 17 on the second interlayer insulating film 16. The structure and process shown in FIG. 28 are the same as those explained in FIG. 15 in the first embodiment. Here, hard-wirings shown on the right side in FIG. 28 are completed through the above process.

Figure 29:
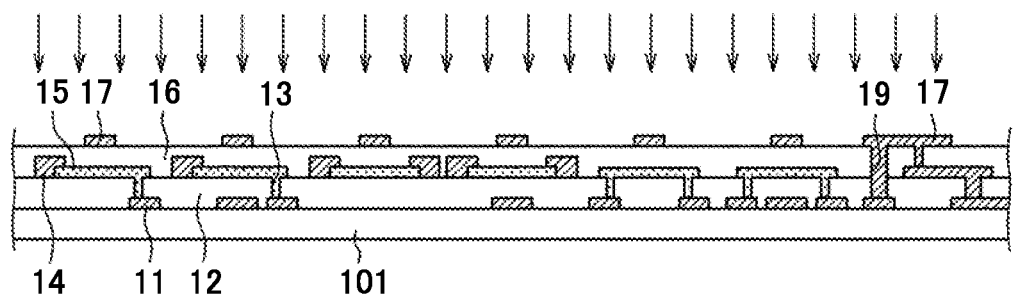
FIG. 29 is a cross-sectional view showing a part of a process in which various types of TFTs used in the second embodiment are formed all at once.

Afterward, if the semiconductor layers are made of silicon, the semiconductor layers 15 except for channel layers located directly below the gate electrodes 17 are given electrical conductivity by ion implantation as shown in FIG. 29. This process is the same as the process explained in FIG. 16 in the first embodiment. In addition, another method in which the oxide semiconductor layers 15 are given electrical conductivity is a method in which the oxide semiconductor layers 15 are annealed while being exposed to a deoxidizing atmosphere, and this process is the same as the process explained in FIG. 16 in the first embodiment.

Figure 30:
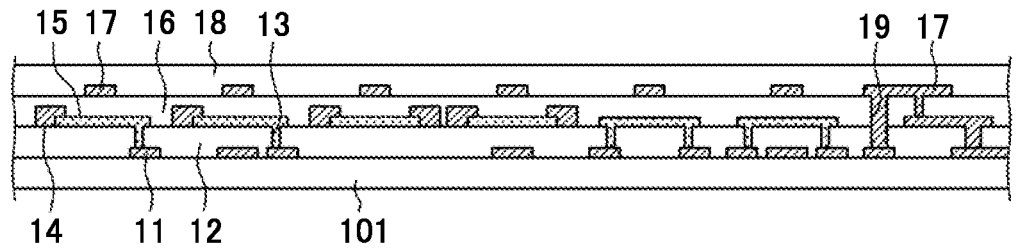
FIG. 30 is a cross-sectional view showing a part of a process in which various types of TFTs used in the second embodiment are formed all at once.

FIG. 30 is a cross-sectional view showing a state in which a third interlayer insulating film 18 is formed so as to cover the third electrode layers 17 as a passivation film. A process shown in FIG. 30 is the same as the process explained in FIG. 17 in the first embodiment.

As shown in FIG. 30, all the TFTs explained in FIG. 20 to FIG. 23 can be formed in the same processes. Furthermore, the TFTs, which are shown in FIG. 8 and FIG. 9 and explained in the first embodiment, can also be formed at the same time. In addition, in the case where TFTs of the same number are formed, the necessary number of through-holes is drastically decreased in FIG. 30 as well. Furthermore, by combining various types of TFTs, it becomes possible to dispose many TFTs in a small space. In addition, as shown on the right side of FIG. 30, necessary hard-wirings can be laid out in the most spatially efficient place.

In this embodiment, because it is also possible that single-gate TFTs and double-gate TFTs can be formed at the same time, as explained in FIG. 18 and FIG. 19, a structure in which both feature of a single-gate TFT and feature of a double-gate TFT are respectively utilized can be fabricated.

Third Embodiment

Although, in the first and second embodiments, cases where the present invention is applied to the organic EL display devices have been explained, the present invention can be advantageously applied to a liquid crystal display device as well. This is because, when a liquid crystal display device is required to have a high resolution, the size of the peripheral driving circuit of the liquid crystal display device becomes large, so it becomes necessary to dispose a large number of TFTs in a limited space.

Figure 31:
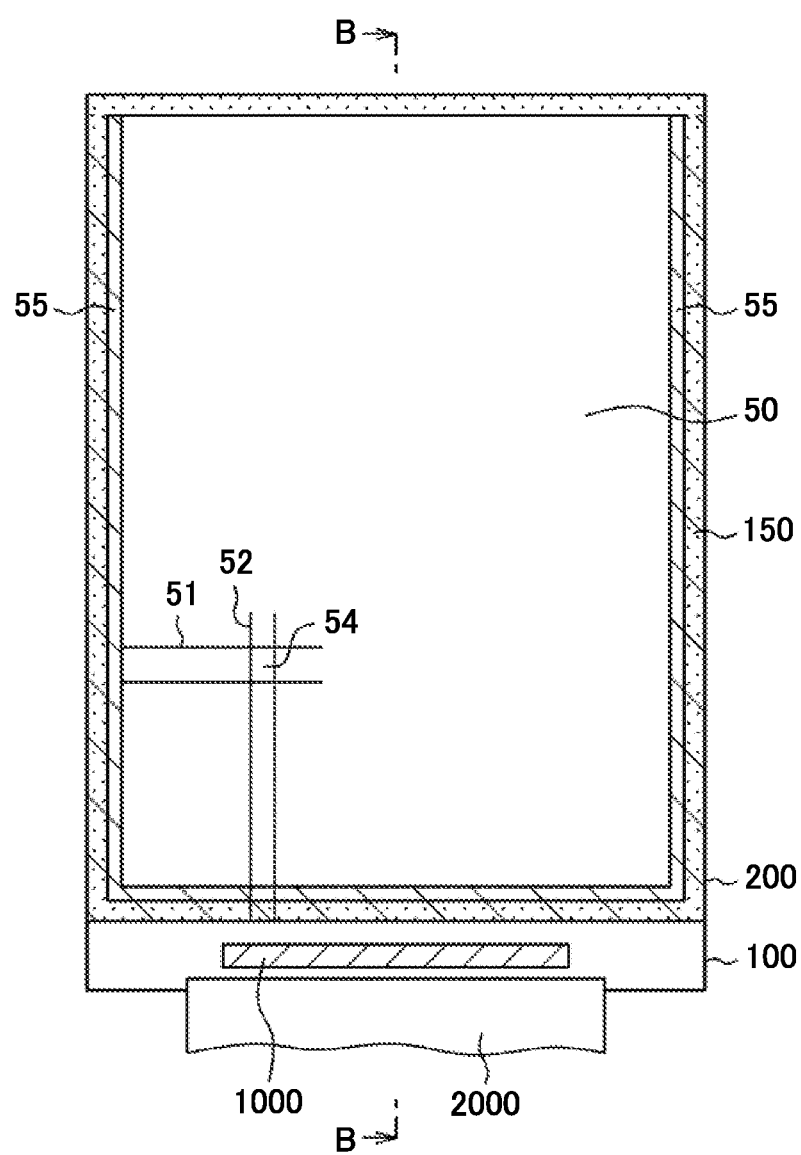
FIG. 31 is a plan view of a liquid crystal display device.

FIG. 31 is a plan view of a liquid crystal display device. In FIG. 31, the periphery of a TFT substrate 100 and the periphery of a counter substrate 200 that faces the TFT substrate 100 are bonded with a sealing material 150, and liquid crystal is encapsulated inside. On the outer side of a display area 50, a peripheral driving circuit 55 including a scanning line driving circuit and the like is composed of TFTs.

In the display area 50, scanning lines 51 extend in a lateral direction, image signal lines 52 extend in the longitudinal direction, and pixels 54 are disposed in areas surrounded by the scanning lines 51 and the image signal lines 52. A terminal unit is formed in the lower part of FIG. 31, and a driver IC 1000 having an image signal driving circuit and the like is mounted on this terminal unit. Furthermore, a flexible wiring board 2000 used for providing electric power and signals to the liquid display device is connected to the terminal unit.

Figure 32:
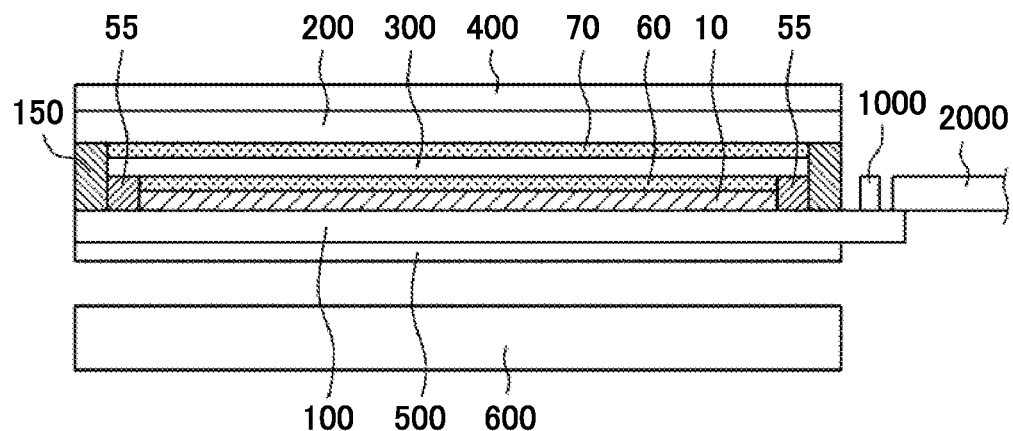
FIG. 32 is a cross-sectional view taken along the line B-B in FIG. 31.

FIG. 32 is a cross-sectional view taken along the line B-B in FIG. 31. In FIG. 32, TFT circuit layer 10 is formed on the TFT substrate 100. An electrode layer 60, which includes pixel electrodes and common electrodes for driving the liquid crystal and the like, is formed on the TFT circuit layer 10. A peripheral driving circuit 55, which includes a large number of TFTs, is formed in the peripheries of the electrode layer 60 and the TFT circuit layer 10. The TFT substrate 100 and the counter substrate 200 are bonded with the sealing material 150, and the liquid crystal layer 300 is encapsulated inside. A color filter layer 70 including a color filter, a black matrix, and the like is formed on the side of the counter substrate 200. A downward polarization plate 500 is pasted to the TFT substrate 100, and an upward polarization plate 400 is pasted to the counter substrate 200. Because the liquid crystal does not emit light by itself, a backlight 600 is disposed at the backside of the liquid display panel of the liquid display device.

Figure 33:
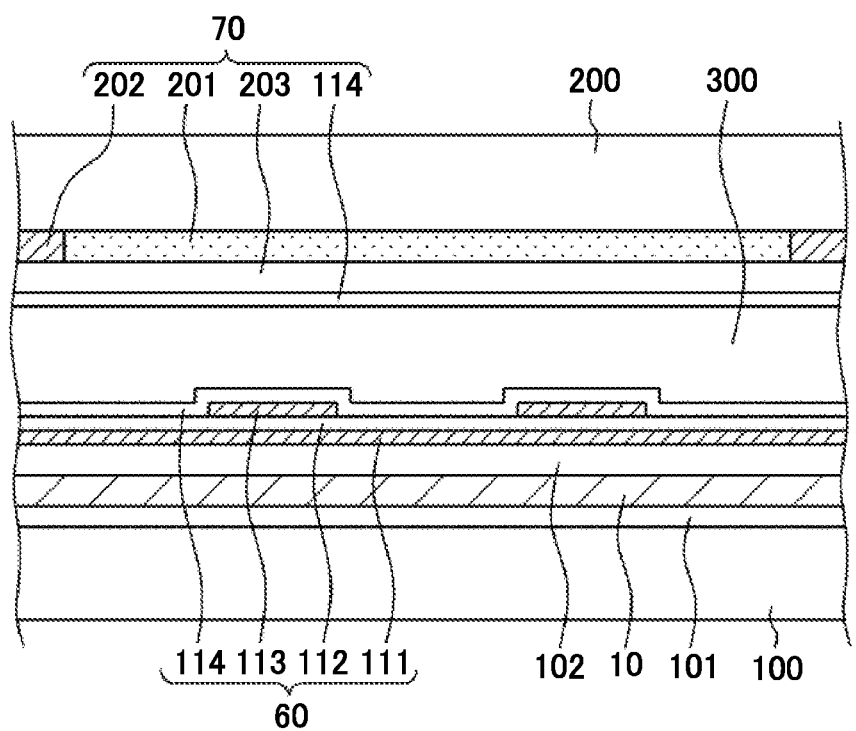
FIG. 33 is a cross-sectional view of a pixel unit of the liquid crystal display device.

FIG. 33 is a cross-sectional view of the display area of the liquid display device. In FIG. 33, an undercoat 101 is formed on the TFT substrate 100, the TFT circuit layer 10 is formed on the undercoat 101, and an organic passivation film 102 is formed on the TFT circuit layer 10. The structure that has been explained about the liquid crystal display device so far is the same as the structure that was explained about the organic EL display device. In FIG. 33, a common electrode 111 is formed on the organic passivation film 102, a capacitive insulating film 112 is formed on the common electrode 111, and pixel electrodes 113 is formed on the capacitive insulating film 112. In addition, an orientation film 114 is formed so as to cover the pixel electrodes 113.

The color filter 201 and the black matrix 202 is formed inside of the counter substrate 200 shown in FIG. 33, the overcoat film 203 is formed so as to cover the color filter 201 and the black matrix 202, and the orientation film 114 is formed so as to cover the overcoat film 203. The liquid crystal is encapsulated between the TFT substrate 100 and the counter substrate 200.

In FIG. 33, the TFT circuit layer 10 includes at least one TFT per pixel. On the other hand, as shown in FIG. 32, the peripheral driving circuit 55 having a large number of TFTs is formed in a frame area that resides outside of the display area. As the screen of the liquid crystal display device gets of higher resolution, the size of the peripheral driving circuit 55 gets larger. However, because the display area is requested to be larger while the outer shape of the liquid crystal display device is kept constant, the frame area needs to become smaller.

Therefore, the liquid crystal display device is also requested to include many TFTS in a limited area as is the case with the organic EL display device. The present invention makes it possible that the mounting density of TFTs is made large, and a high-resolution screen is realized while the frame area is kept small because various types of TFTs can be formed on the same board as described in the first and second embodiments.

What is claimed is:

1. A display device comprising:
    a display area in which pixels are disposed; and
    a TFT substrate on which a driving circuit is disposed,
        wherein the pixels or the driving circuit include TFTs each of which is formed in such a way that a first gate electrode of each TFT is formed relative to a semiconductor layer with a first gate insulating film therebetween, and one of a drain electrode and a source electrode of each TFT that is connected to the semiconductor layer is formed at a layer different from a layer at which the other is formed,
        at least one of the drain electrode and the source electrode is connected to the semiconductor layer via a through-hole, and
        the semiconductor layer extends into an inside of the through-hole.

2. The display device according to claim 1, wherein one of the drain electrode and the source electrode is laminated on the semiconductor layer.

3. The display device according to claim 1, wherein the one of the drain electrode and the source electrode is connected to the semiconductor layer via the through-hole, and
    the semiconductor layer is laminated on an other of the drain electrode and the source electrode.

4. The display device according to claim 1, wherein a second gate insulating film is formed on one side of the semiconductor layer that is opposite to another side of the semiconductor layer on which the first gate insulating film is formed, and a second gate electrode is formed relative to the semiconductor layer with the second gate insulating film therebetween.

5. The display device according to claim 4, wherein a thickness of the first gate insulating film is thinner than a thickness of the second gate insulating film.

6. The display device according to claim 4, wherein a width of the first gate electrode in a direction in which the drain electrode and the source electrode face each other is smaller than a width of the second gate electrode in the direction in which a drain portion and a source portion face each other.

7. The display device according to claim 1, wherein the display device is an organic EL display device.

8. The display device according to claim 1, wherein the display device is a liquid crystal display device.

9. A display device comprising:
a display area in which pixels are disposed; and
a TFT substrate on which a driving circuit is disposed,
wherein the pixels or the driving circuit includes: first TFTs each of which is formed in such a way that one of a first drain electrode and a first source electrode of each TFT that are connected to a first semiconductor layer is formed at a layer different from a layer at which the other is formed; and
second TFTs each of which is formed in such a way that a second drain electrode and a second source electrode of each TFT that are connected to a second semiconductor layer are formed at the same layer.

10. The display device according to claim 9, wherein the second drain electrode and the second source electrode of each of the second TFTs are in contact with the lower surface of the second semiconductor layer.

11. The display device according to claim 9, wherein the second drain electrode and the second source electrode of each of the second TFTs are in contact with the upper surface of the second semiconductor layer.

12. The display device according to claim 10, wherein one of the first drain electrode and the first source electrode of each of the first TFTs is in contact with the lower surface of the first semiconductor layer.

13. The display device according to claim 11, wherein one of the first drain electrode and the first source electrode of each of the first TFTs is in contact with the upper surface of the first semiconductor layer.

14. The display device according to claim 9, wherein each of the first TFTs includes a first gate electrode formed on one surface side of the first semiconductor layer and a second gate electrode formed on the other surface side of the first semiconductor layer.

15. The display device according to claim 9,
wherein the first semiconductor layer and the second semiconductor layer are formed on a first insulating layer, the first semiconductor layer and the second semiconductor layer are covered by a second insulating layer;
the first semiconductor layer makes contact with the first drain electrode and the first source electrode via first through-holes formed at the first insulating layer; and
the second semiconductor layer is connected to the second drain electrode via a second through-hole formed at the first insulating layer, and connected to the second source electrode via a third through-hole formed at the first insulating layer.

16. The display device according to claim 15, wherein each of the first TFTs includes a first gate electrode disposed via the first insulating layer and a second gate electrode disposed via the second insulating layer.

17. The display device according to claim 15, wherein each of the second TFTs includes a third gate electrode disposed via the first insulating layer and a fourth gate electrode disposed via the second insulating layer.

* * * * *